US007151251B2

(12) United States Patent
Kim et al.

(10) Patent No.: US 7,151,251 B2

(45) Date of Patent: Dec. 19, 2006

(54) CONNECTOR AND IMAGE SENSOR MODULE USING THE SAME

(75) Inventors: Sang-Ho Kim, Gumi-si (KR); Yeong-Seop Lee, Gumi-si (KR); Hyun-Ju Lee, Gyeongsangbuk-do (KR); Do-Hyung Lee, Daegu (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/838,061

(22) Filed: May 3, 2004

(65) Prior Publication Data

US 2005/0059269 A1 Mar. 17, 2005

(30) Foreign Application Priority Data

Sep. 16, 2003 (KR) ..................... 10-2003-0064039

(51) Int. Cl.

*G01J 40/14* (2006.01)
*H01L 27/00* (2006.01)
*H01L 31/203* (2006.01)

(52) U.S. Cl. ................... 250/239; 250/208.1; 257/434

(58) Field of Classification Search ................ 250/239, 250/208.1; 257/431–434

See application file for complete search history.

(56) References Cited

U.S. PATENT DOCUMENTS 5,258,648 A * 11/1993 Lin ............................ 257/778
5,365,088 A * 11/1994 Myrosznyk ................. 257/186
5,834,799 A * 11/1998 Rostoker et al. .............. 257/98
6,598,291 B1 7/2003 Parker, Jr. et al. ............ 29/846

* cited by examiner

*Primary Examiner*—Thanh X. Luu
*Assistant Examiner*—Stephen Yam
(74) *Attorney, Agent, or Firm*—Cha & Reiter, L.L.C.

(57) ABSTRACT

A conductive connector for use by an image module connects electrically a first electric circuit substrate having a first conductive pattern to a second electric circuit substrate having a second conductive pattern. The conductive connector includes an insulating substrate located between the first electric circuit substrate and the second electric circuit substrate, and has at least one hole formed by perforation, and a conductive filling material filled in the hole for electrically connecting the first conductive pattern to the second conductive pattern.

8 Claims, 3 Drawing Sheets

550
540
510
512
520
511
532
531
521
560
530

CONNECTOR AND IMAGE SENSOR MODULE USING THE SAME

CLAIM OF PRIORITY

This application claims priority to an application entitled "Connector and Image Sensor Module Using The Same," filed in the Korean Intellectual Property Office on Sep. 16, 2003 and assigned Serial No. 2003-64039, the contents of which are hereby incorporated by reference.

BACKGROUND OF THE INVENTION

1. Field of the Invention

The present invention relates to an electric connector structure, and more particularly to an image sensor module having an image sensor connected electrically to a printed circuit board.

2. Description of the Related Art

Generally, an image sensor module is configured to photograph a subject using an image sensor, such as a CCD (charge coupled device) or a CMOS that are capable of achieving photoelectric transformation and charge-coupling, to output an electric signal corresponding to the photographed image. The image sensor module includes a printed circuit board (PCB), the image sensor, a device for electrically connecting the PCB to the image sensor, a housing for protecting each of above-mentioned parts, and a lens system for inputting into the image sensor an optical signal embodying the subject.

The image sensor includes the CCD or the CMOS, and converts to an electrical signal an optical signal obtained by photographing the subject. Pixels for converting the optical signal into the electric signal are disposed on an upper surface of the image sensor. Conductive patterns capable of conducting each of electric signals converted by the pixels are formed on the image sensor. These conductive patterns are wire bonded to conductive patterns formed on an upper surface of the PCB, the latter patterns being connected electrically to the image sensor in such a manner so as to detect the electric signal converted by the image sensor and to transmit the electric signal to an exterior.

Methods of manufacturing the above-mentioned image sensor module include a COB (Chip On Board Type) process, a COF (Chip On Film Type) process, and a CSP (Chip Size Package) process.

FIG. 1 is a view showing a conventional COB-type image sensor module, which has an image sensor 120 bonded to an upper surface of a PCB 110. The image sensor 120 includes conductive patterns 122 and a pixel 121 for detecting radiated light, and is bonded to an upper center portion of the PCB 110, on which the conductive patterns 111 are formed, by a die bonder. The image sensor 120 is electrically connected to the conductive patterns 111 formed on the PCB 110 by a wire bonding 160, and is protected by a housing 150 mounted on the PCB 110.

An infrared cut-off filter 130 is fixed to an upper portion of the housing 150 in opposition to the image sensor 120. Also, a lens system 140 is fixed to the infrared cut-off filter 130 in order to converge light radiated into the image sensor 120.

However, the above-mentioned COB-type image sensor module has a problem in that the pixel of the image sensor is easily contaminated by impurities.

FIG. 2 is a view showing a conventional COF-type image sensor module. Referring to FIG. 2, the COF-type image sensor module has an image sensor 220 affixed to a lower portion of a PCB 210, which is formed at a center portion thereof with a hole 212, through an ACF (Anisotropic Conductive Film). The ACF includes a conductive ball and is melted when pressure or heat is applied thereto, in such a manner that the image sensor 220 is electrically bonded to the PCB 210.

The image sensor 220 has conductive patterns 222 and a pixel 221 at one side, and is bonded to the PCB 210 in such a manner that the pixel faces a hole 212 of the PCB. Conductive patterns 211 formed on the PCB 210 are adhered by the conductive pattern 222 of the image sensor 220 and the conductive ball 230.

A cap-type housing 260 is mounted on an upper surface of the PCB 210, and fixes an infrared cut-off filter 240 located at an upper portion of the housing. The lens system 250 is set on an upper portion of the housing 260 opposed to the pixel 221 and aligned with the infrared cut-off filter 240 so as to guide radiated light into the pixel.

However, the image sensor is likewise easily contaminated by impurities, and the COF-type image sensor module has a further problem in that the bonding force of the ACF varies widely in dependence on temperature.

FIG. 3 is a view showing a conventional CSP-type image sensor module. Referring to FIG. 3, the CSP-type image sensor module includes an image sensor 320, which is formed at an upper surface thereof with a pixel 321 and is formed at a lower surface thereof with conductive patterns 322 electrically connected to the pixel 321. In addition, a glass substrate 370 is bonded to the upper surface of the image sensor 320 so as to enclose the pixel 321, thereby preventing the pixel from being contaminated by impurities.

The image sensor 320 is bonded to an upper surface of a PCB 310, which is formed at the upper surface thereof with conductive patterns 311, by an oven reflow process.

Namely, a solder ball (not shown) is inserted between the PCB 310 and the image sensor 320, and is melted through the oven reflow process, thereby electrically bonding the image sensor 320 to the PCB 310.

The above-mentioned CSP-type image sensor module includes a housing mounted on the PCB 310, an infrared cut-off filter 330 fixed to an upper portion of the housing 350, and a lens system 340.

Problematically, however, processes are required for connecting the pixel of the image sensor to the conductive patterns and for bonding the glass substrate to an upper surface of the image sensor, because the pixel and conductive patterns are formed on upper and lower surfaces of the image sensor. These additional process steps drive up manufacturing cost because of the increased number of steps and parts required.

SUMMARY OF THE INVENTION

The present invention has been made to solve the above-mentioned problems occurring in the prior art, and an object of the present invention is to provide a conductive connector structure capable of preventing faults in articles caused by impurities and capable of improving productivity by easily achieving an electrical connection.

In order to accomplish the above object, there is provided a conductive connector electrically connecting a first electric circuit substrate having a first conductive pattern to a second electric circuit substrate having a second conductive pattern. The conductive connector includes an insulating substrate located between the first electric circuit substrate and the second electric circuit substrate, and has at least one hole formed by perforating the insulating substrate. A conductive filling material fills in the hole to electrically connect the first conductive pattern to the second conductive pattern.

BRIEF DESCRIPTION OF THE DRAWINGS

The above object and other features and advantages of the present invention will be more apparent from the following detailed description taken in conjunction with the accompanying drawings, in which the same reference numerals are used to designate the same or similar components throughout the several views.

DETAILED DESCRIPTION

Preferred embodiments of the present invention are described below with reference to the accompanying drawings. Detailed description of known functions and configurations incorporated herein is omitted for clarity of presentation.

Figure 1:
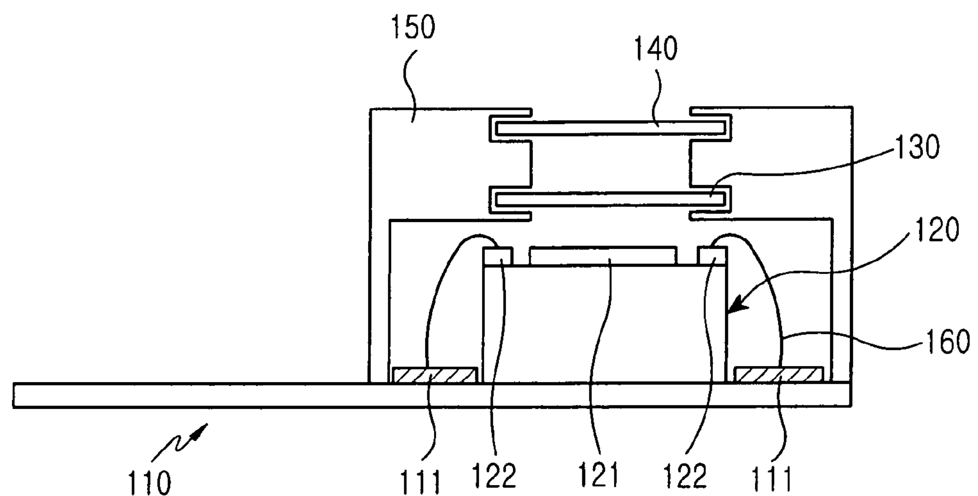
FIG. 1 is a view showing a conventional COB type image sensor module.
Figure 2:
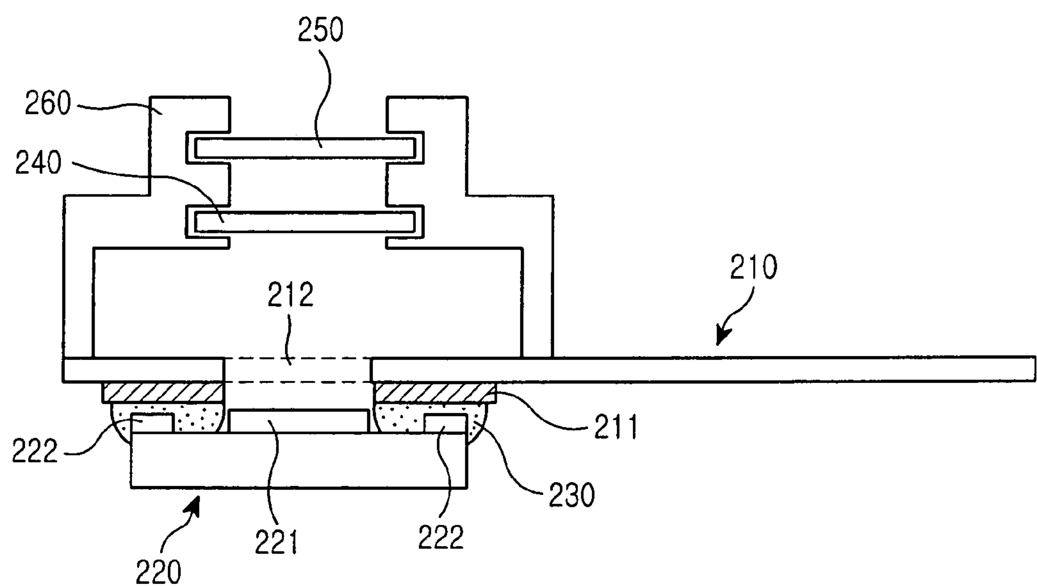
FIG. 2 is a view showing a conventional COF type image sensor module.
Figure 3:
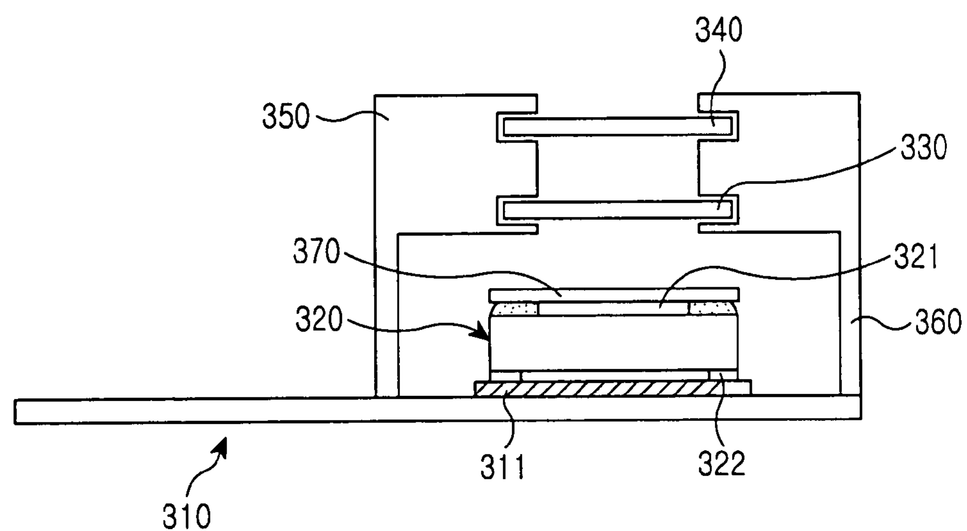
FIG. 3 is a view showing a conventional CSP type image sensor module.
Figure 4:
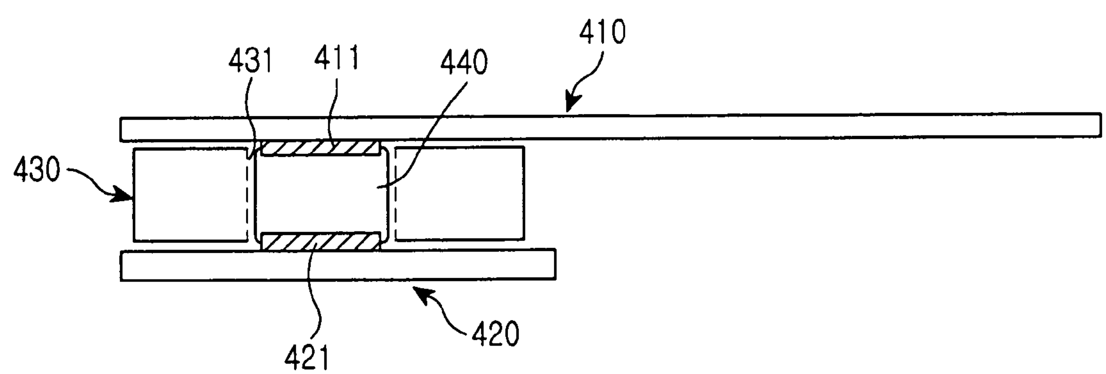
FIG. 4 is a view showing a conductive connector structure according to one embodiment of the present invention.

FIG. 4 is a view showing, by way of illustrative and non-limitative example, a conductive connector structure according to one embodiment of the present invention. As shown in FIG. 4, the conductive connector according to the present invention includes a first electric circuit substrate 410, a second electric circuit substrate 420, an insulating substrate 430 having at least one hole 431 formed by perforating the insulating substrate, and a conductive filling material 440 filled in the hole 431 for electrically connecting the first electric circuit substrate 410 to the second electric circuit substrate 420.

The first electric circuit substrate 410 has formed at its upper surface a first conductive pattern 411, and the second electric circuit substrate 420 has formed at its lower surface a second conductive pattern 421. The second electric circuit substrate 420 and the first electric circuit substrate 410 are located in such a manner that the first conductive pattern 411 is opposed to the second conductive pattern 421.

As the insulating substrate 430 is located between the first electric circuit substrate 410 and the second electric circuit substrate 420, the second conductive pattern 421 is inserted into a lower portion of the hole 431, and the first conductive pattern 411 is inserted into an upper portion of the hole 431.

The insulating substrate 430 includes glass or plastic having a superior electrical insulation property. Also, the insulating substrate 430 is bonded to each of the first electric circuit substrate 410 and the second electric circuit substrate 420 by means of an adhesive agent, such as epoxy coated between the first electric circuit substrate and the second electric circuit substrate. The adhesive agent including epoxy is coated on the whole area of the insulating substrate 430 except for the hole 431.

The conductive filling material 440 includes a solder ball. After the solder ball has been inserted into each of an upper end portion and a lower end portion of the hole 431, heat is applied to the solder ball to melt it, so that the first conductive pattern 411 is electrically connected to the second conductive pattern 421. The solder ball is inserted into the hole 431 before the insulating substrate 430 is bonded to the first electric circuit substrate 410 and the second electric circuit substrate 420.

Figure 5:
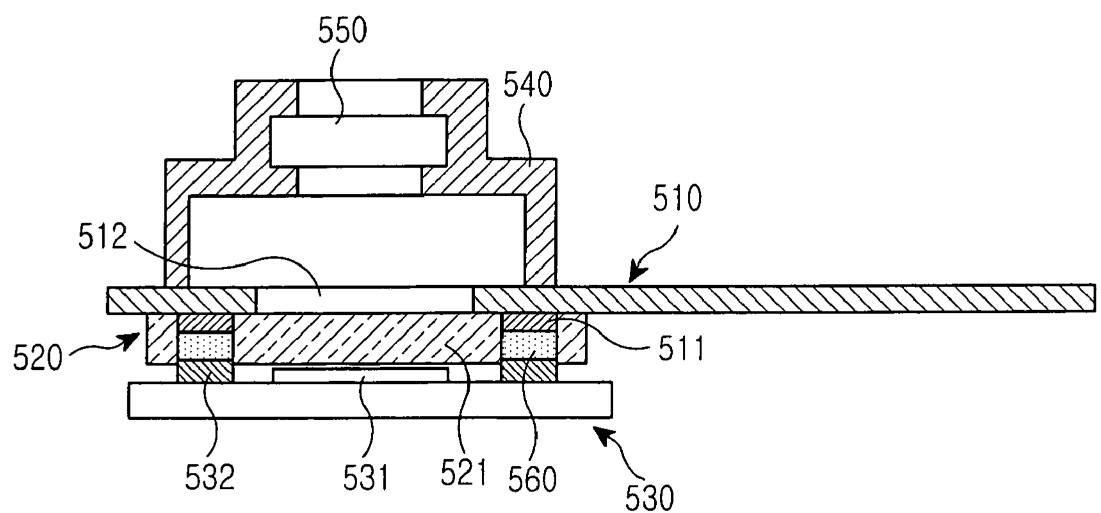
FIG. 5 is a sectional view showing a structure of an image sensor module according to a first embodiment of the present invention.

FIG. 5 is a sectional view showing one example of a structure of an image sensor module according to a first embodiment of the present invention. Referring to FIG. 5, the image sensor module includes an image sensor 530, a PCB 510, an insulating substrate 520, a housing 540 for supporting the PCB 510, and a lens system 550.

The image sensor 530 includes a pixel 531 for converting radiated light into an electric signal and at least one first conductive pattern 532 outputting the electric signal converted by the pixel 531 to an exterior.

The PCB 510 includes a second conductive pattern 511 and a hole 512, can output the electric signal inputted from the image sensor 530 to an exterior thereof, and can allow radiated light to pass the pixel 531. The PCB 510 is classified into a flexible PCB and a rigid PCB. Each of the first conductive pattern 532 and the second conductive pattern 511 is formed with metallic material, such as Au and Cu.

The insulating substrate 520 includes at least one hole 521 as a path which electrically connects the first conductive pattern 532 to the second conductive pattern 511. The insulating substrate 520 uses a glass substrate in such a manner that radiated light is converged into the pixel 531. Also, an infrared filter is formed on the insulating substrate 520.

One side of the insulating substrate 520 is bonded to one side of the PCB 510 on which the second conductive pattern 511 is formed, and the other side of the insulating substrate 520 is bonded to one side of the image sensor 530 on which the first conductive pattern 532 is formed. The insulating substrate 520 is bonded to one end of each image sensor 530 and PCB 510 by applying adhesive, such as epoxy, to a predetermined portion of the insulating substrate 520 in which the hole 521 is not formed.

The second conductive pattern 511 of the PCB 510 is inserted in an upper portion of the hole 521, and the first conductive pattern 532 of the image sensor 530 is inserted in a lower portion of the hole 521. Therefore, the first conductive pattern 532 is opposed to the second conductive pattern 511.

Namely, the insulating substrate 520 is bonded to one side of the image sensor 530 having the pixel 531 and the first conductive pattern 532, thereby preventing the pixel 531 from becoming contaminated by impurities. Also, as the hole 521 performs the role of a path electrically connecting the second conductive pattern 511 to the first conductive pattern 532, the second conductive pattern 511 thereby being connected electrically to the first conductive pattern 532 in an easy manner.

Also, the first conductive pattern 532 of the image sensor 530 and the second conductive pattern 511 of the PCB 510 are electrically connected with each other, through a conductive filling material 560 filled in the hole 521. The conductive filling material 560 includes a solder ball. The solder ball is inserted into a lower portion and an upper portion of the hole 521 before the insulating substrate 520 is bonded to the image sensor 530 and the PCB 510. The solder ball is melted through the oven reflow process, thereby electrically connecting the first conductive pattern 532 to the second conductive pattern 511.

The cap-type housing 540 is mounted on the PCB 510, and the lens system 550 is fixed to an upper portion of the housing 540. Radiated light is converged at the pixel 531 of the image sensor 530 through the lens system 550.

The present invention offers the consequent advantage of an image sensor module that is easily fabricated, features an improved yield rate, and avoids contamination by impurities.

Figure 6:
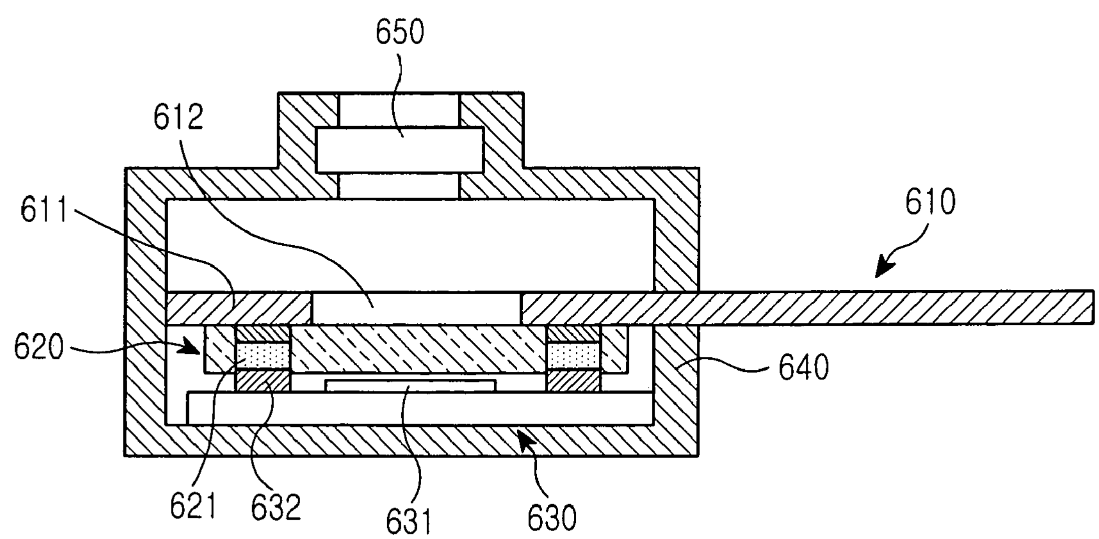
FIG. 6 is a view showing a structure of an image sensor module according to a second embodiment of the present invention.

FIG. 6 is an exemplary view showing a structure of an image sensor module according to a second embodiment of the present invention. Referring to FIG. 6, an image sensor module includes an image sensor 630 formed at its upper portion with a pixel 631 and a first conductive pattern 632, a PCB 610 formed at its center portion with a hole 612 and formed at its lower portion with a second conductive pattern 611, an insulating substrate 620 located between the PCB and the image sensor and having a piercing hole 621 as a path electrically connecting the first conductive pattern to the second conductive pattern, a housing 640 for accommodating above-mentioned parts, and a lens system 650 for converging radiated light to the pixel of the image sensor.

The housing 640 protects above-mentioned parts from an external environment, by accommodating a predetermined part of the PCB 610, the image sensor 630, and the insulating substrate 620 therein.

As described above, the conductive connector of the present invention can be simply fabricated, with electrical connection and assembly of the electric circuit substrate formed with the conductive patterns being easily carried out. Likewise, the electrical connection and the assembling work between the image sensor and the PCB is easily accomplished. In addition, when fabricating the image sensor module including the image sensor and the printed circuit board, the image sensor is effectively prevented from being contaminated by impurities.

While the present invention has been shown and described with reference to certain preferred embodiments thereof, it will be understood by those skilled in the art that various changes in form and details may be made therein without departing from the spirit and scope of the invention as defined by the appended claims.

What is claimed is:

1. An image sensor module comprising:

an image sensor for converting radiated light into an electric signal, and having at least one conductive pattern for outputting the electric signal;

a printed circuit board (PCB), having a window for enabling the radiated light to be converged into the image sensor, for inputting from the image sensor the electric signal and outputting the electric signal externally from the module;

an insulating substrate located between the image sensor and the PCB, and having at least one hole formed by perforating the insulating substrate; and a conductive filling material filled in the hole for electrically connecting the conductive pattern of the image sensor to an electric circuit substrate.

2. The image sensor module as claimed in claim 1, wherein the image sensor has an upper surface, the conductive pattern of the image sensor being bumped at said upper surface adjacent to the hole with metallic material.

3. The image sensor module as claimed in claim 1, wherein the insulating substrate is bonded to the PCB by epoxy applied to the insulating substrate except for the hole.

4. The image sensor module as claimed in claim 1, wherein the filling material filled in the hole includes a conductive solder ball.

5. The image sensor module as claimed in claim 1, wherein the insulating substrate has an upper surface that is provided with an infrared filter.

6. The image sensor module as claimed in claim 1, wherein the insulating substrate includes glass.

7. The image sensor module as claimed in claim 1, further comprising:

a housing having a center, lower portion and upper portion, and, formed at said center, a window for allowing light to transmit through the housing, the PCB being fixed to said lower portion; and a lens system set on said upper portion such that the lens system is opposed to the PCB and aligned with the window of the housing.

8. The image sensor module as claimed in claim 1, the module having an upper portion, the module further comprising:

a housing having a lower portion and formed at said upper portion, the housing being opposed to the PCB, the housing having a window for allowing light to transmit through the housing, the window having an upper portion, the image sensor being fixed to said lower portion; and a lens system positioned at the upper portion of the window.

* * * * *